United States Patent
Gong

(10) Patent No.: US 8,236,613 B2
(45) Date of Patent: Aug. 7, 2012

(54) WAFER LEVEL CHIP SCALE PACKAGE METHOD USING CLIP ARRAY

(75) Inventor: Yuping Gong, Shanghai (CN)

(73) Assignee: Alpha & Omega Semiconductor Inc., Sunnyvale, CA (US)

( * ) Notice: Subject to any disclaimer, the term of this patent is extended or adjusted under 35 U.S.C. 154(b) by 150 days.

(21) Appl. No.: 12/786,328

(22) Filed: May 24, 2010

(65) Prior Publication Data

US 2011/0285025 A1 Nov. 24, 2011

(51) Int. Cl.
*H01L 21/301* (2006.01)
(52) U.S. Cl. .. 438/114; 438/112; 438/461; 257/E23.048
(58) Field of Classification Search .............. 257/670, 257/672, 696, 735, E23.048, E23.047, E23.061, 257/E23.068, E23.185, E23.186, E21.502; 438/461, 114, 112
See application file for complete search history.

(56) References Cited

U.S. PATENT DOCUMENTS

| | | | | |
|---|---|---|---|---|
| 3,550,261 A | * | 12/1970 | Schroeder | 438/461 |
| 6,107,164 A | * | 8/2000 | Ohuchi | 438/465 |
| 6,943,056 B2 | * | 9/2005 | Nemoto | 438/106 |
| 7,122,884 B2 | * | 10/2006 | Cabahug et al. | 257/676 |
| 7,662,670 B2 | * | 2/2010 | Noma et al. | 438/114 |
| 7,939,383 B2 | * | 5/2011 | Huang et al. | 438/127 |
| 2005/0095750 A1 | * | 5/2005 | Lo et al. | 438/114 |
| 2008/0277793 A1 | * | 11/2008 | Noma et al. | 257/758 |
| 2010/0140794 A1 | * | 6/2010 | Poo et al. | 257/735 |

* cited by examiner

*Primary Examiner* — Kiesha Bryant
*Assistant Examiner* — Abbigale Boyle
(74) *Attorney, Agent, or Firm* — Chein-Hwa Tsao; C H Emily LLC

(57) ABSTRACT

A method for wafer level chip scale package comprises providing a wafer with semiconductor chips formed thereon, forming a groove alongside each chip, providing a wafer size clip array with a plurality of clip contact areas each extending to a down set connecting bar, connecting the plurality of clip contact areas to a plurality of the electrodes disposed on a top surface of the chips with down set connecting bars disposed inside the grooves, encapsulating top of wafer in molding compound, thinning the bottom portion of the wafer and dicing the thin wafer into single chip packages. The chip has source and gate electrodes on a top surface connected to a first and second clip contact areas extending to a first a second down set connecting bars respectively, with the bottom surfaces of the down set connecting bars substantially coplanar to a drain electrode located at the chip bottom surface.

13 Claims, 6 Drawing Sheets

WAFER LEVEL CHIP SCALE PACKAGE METHOD USING CLIP ARRAY

TECHNICAL FIELD

The invention relates to a semiconductor chip encapsulation and manufacturing method thereof, in particular to a wafer level chip scale package and the method of encapsulation of the semiconductor chips at the wafer level using clip array.

BACKGROUND TECHNOLOGY

In the process of manufacturing semiconductors device, a plurality of circuit structures are usually manufactured on a wafer, then the wafer is cut and divided into a plurality of chips; each of the chips is disposed on a chip carrier or lead frame with bonding wires connecting the electrodes on the chip to the leads of the lead frame that are partially exposed through an encapsulation for external connection therefore providing various semiconductor package products. Alternatively solder bumps may be attached to the electrodes of the chip on wafer level and the wafer is then diced to singulate the chips, each solder-bumped chip is then flip-chip attached on a baseboard for connecting the electrodes to the external of encapsulation.

The encapsulation methods of prior arts include the steps of cutting the wafer to obtain the individual semiconductor elements first, then attaching each semiconductor element onto the base plate and connecting the electrodes of the semiconductor element through lead wire or flip chip bonding, and finally plastically packaging the semiconductor element. The wafer carrying the chips for encapsulation is cut first and then the electrodes of the semiconductor elements are connected and encapsulated; the manufacturing procedures of the encapsulation are manifold; and the single encapsulation of each semiconductor element enlarges the size of the encapsulation and increases the cost of manufacture, which is not suitable for the ever increasing demand of miniaturization and low cost for the hand held electronic device applications. Therefore a method to produce a wafer level chip scale package is needed.

SUMMARY OF INVENTION

The invention aims at providing a wafer level chip scale package using wafer size clip array and the methods thereof. In one embodiment the wafer level chip scale package according to the invention comprises a semiconductor chip having a first electrode and a second electrode on a top surface and a third electrode on a bottom surface; the wafer level chip scale package further comprises a clip having a first clip contact area connected to the first electrode and a second clip contact area connected to the second electrode, wherein the first clip contact area extending and connecting to a first down set connecting bar and the second clip contact area extending and connecting to a second down set connecting bar, wherein the first and second connecting bars being disposed away from an edge of the semiconductor chip and having bottom surfaces substantially coplanar to the bottom surface of the semiconductor chip.

In another embodiment the wafer level chip scale package according to the invention further comprises a molding material encapsulating the semiconductor chip and the clip, wherein the bottom surface of the semiconductor chip and the bottom surfaces of the first and second down set connecting bars exposed through the molding material encapsulation.

The encapsulation method includes the steps of leading out the top electrodes of each chip on the wafer through the wafer size clip array and then implementing mould pressing and encapsulation on the wafer level a top portion of the wafer; thinning the wafer to a desired chip thickness and exposing the electrodes of the semiconductor chips led out the clips through grinding the bottom portion of the wafer, and finally cutting the thin wafer into singular chip package. In one embodiment of the invention, a method for wafer level chip scale package comprises:

providing a wafer with a top portion and a bottom portion; wherein the top portion of wafer comprises a semiconductor chip formed thereon with a plurality of top electrode contact areas disposed on a top surface of the semiconductor chip and a groove disposed along side the semiconductor chip on the top portion of the wafer;

providing a clip having a plurality of clip contact areas corresponding to the plurality of top electrode contact areas of the semiconductor chip; each clip contact area extends and contacts to a down set connecting bar;

displacing the clip on top of the semiconductor chip with the plurality of clip contact areas electrically connected to the plurality of the top electrode contact areas on the semiconductor chip; wherein each of the down set connecting bars disposed within the groove; and providing a molding material to encapsulate the top portion of the wafer and at lease a portion of the clip, wherein the molding material substantially filling the groove.

In one embodiment, the step of providing a clip further comprises a step of providing an array of clips. In another embodiment, the step of providing a clip further comprises a step of providing a wafer scale array of clips.

In another embodiment, the method may further comprise a step of thinning the bottom portion of the wafer until a bottom surface of each of the down set connecting bar exposed on the bottom of the wafer.

In another embodiment, the method may further comprise a step of dicing the wafer into a plurality of wafer level chip scale package.

The method provided hereby simplifies the process flow of encapsulation, reduces the encapsulation size of the chips, and reduces the manufacturing cost. The process of grinding the bottom portion of the wafer with the wafer scale clip attached and molding material encapsulating the top portion of the wafer enables the production of ultra-thin wafers that a normal bare wafer grinding process can not achieve due to the difficulty in handling the fragile ultra-thin wafer. This greatly reduces the substrate thickness therefore the substrate resistance of the chips.

DETAILED DESCRIPTION OF INVENTION

The invention provides a wafer level chip scale package of semiconductor chips by disposing a wafer size clip array 2 on top of a wafer 1, and encapsulating the clip array and a top portion of the wafer with a plastically packaged body 3.

Figure 1A:
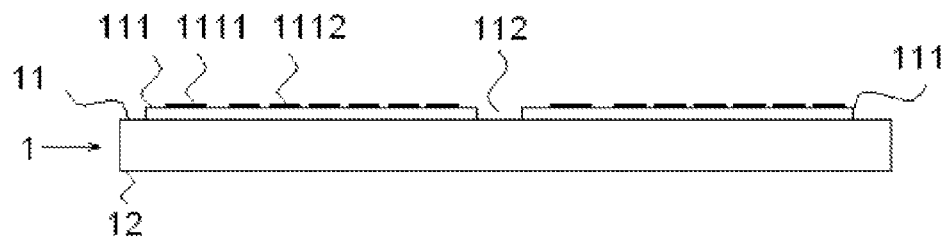
FIG. 1A is a cross sectional view of a section of wafer structure according to current invention.
Figure 1B:
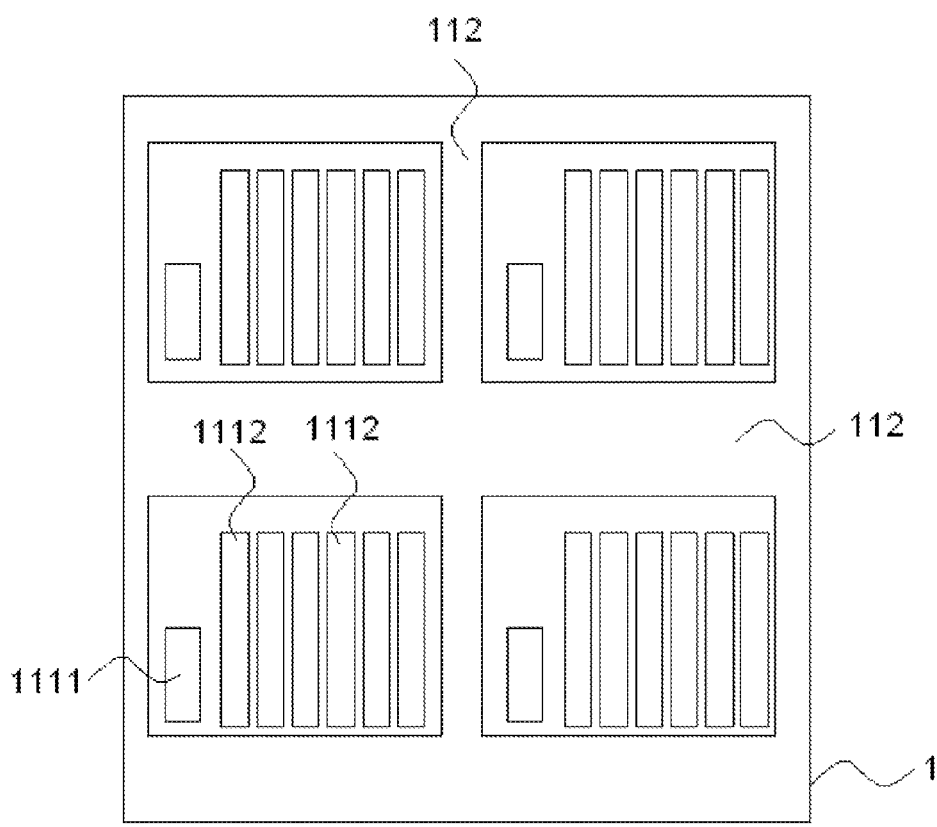
FIG. 1B is a top view of the wafer section in FIG. 1A.

As shown, FIG. 1A and FIG. 1B are respectively a cross sectional view and a top view of a portion of wafer 1. The wafer 1 is provided with a top portion 11 of the wafer and a bottom portion 12 of the wafer. A plurality of chips 111 are manufactured at the top portion of the wafer; and groove areas 112 are arranged between the chips 111 on the top portion 11 of the wafer; each chip 111 corresponds to a groove area 112; the neighboring groove areas can be mutually separated or alternatively can be extended and connected into each other. In one preferable embodiment, the groove areas divide a plurality of chips 111 into each chip unit along longitudinal and transverse directions between the chips 111. The groove areas 112 surrounding each chip may further function as scribe lines of the wafer. In another preferable embodiment, the groove areas 112 are arranged in only one direction (not shown). An upper surface of each chip is provided with a plurality of top electrode contact areas 1111 and 1112. When a top electrode contact area is large, the large top electrode contact area can be patterned into a plurality of sub-areas, such as the source electrode contact area 1112 shown in FIG. 1A and FIG. 1B. The bottom portion of the chip can be provided with a bottom electrode of the chip or alternatively can be provided without a bottom electrode. In one preferable embodiment, the chip 111 is a power semiconductor field effect transistor provided with top and bottom electrodes; the top electrode contact area 1111 of the chip is a gate of the semiconductor field effect transistor; and the electrode contact area 1112 of the chip is a source electrode of the semiconductor field effect transistor. The chip 111 further comprises a drain electrode located on the bottom of the chip (not shown). In another preferable embodiment, all the electrodes of the chip 111 are arranged at the top surface of the chip.

Figure 2A:
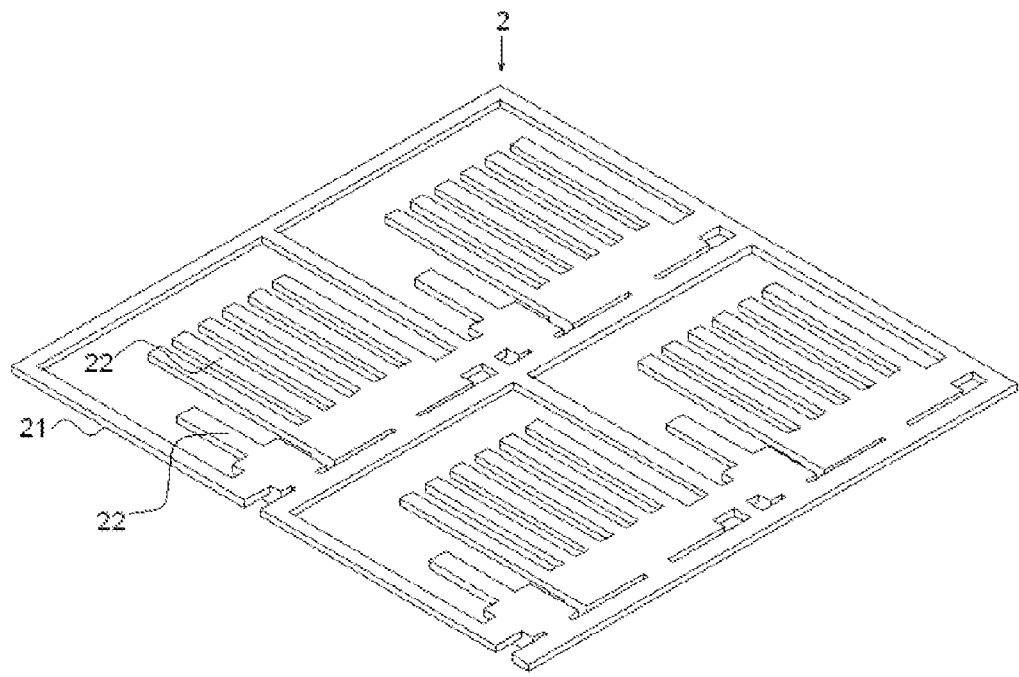
FIG. 2A is a perspective view from the upper surface of a section of a clip array structure according to the invention.
Figure 2B:
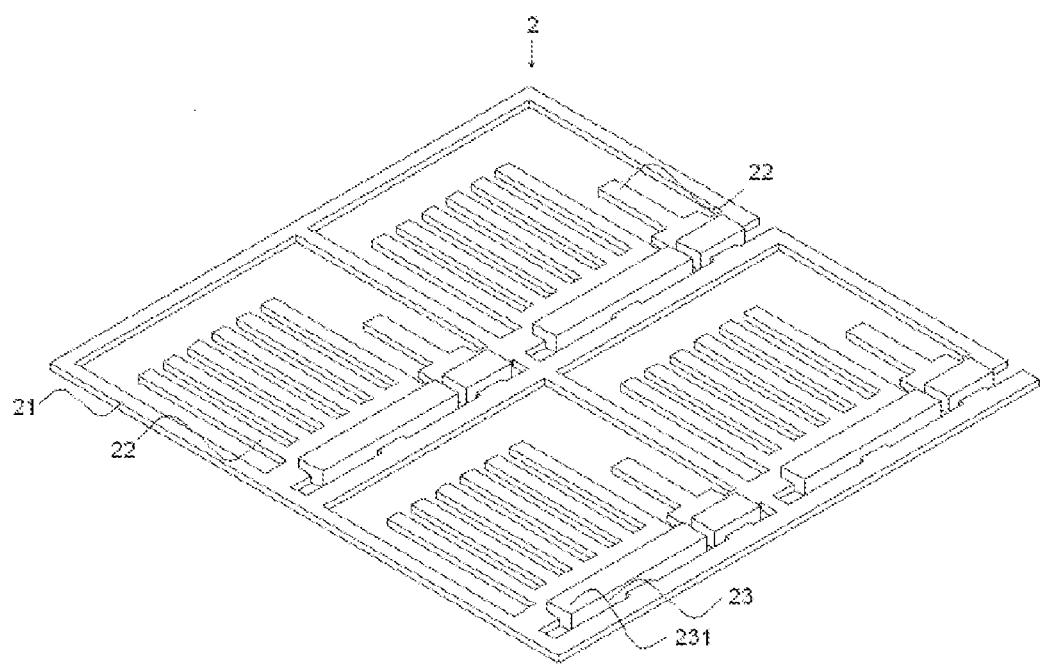
FIG. 2B is a perspective view from the bottom surface of the section of clip array structure of FIG. 2A.
Figure 3A:
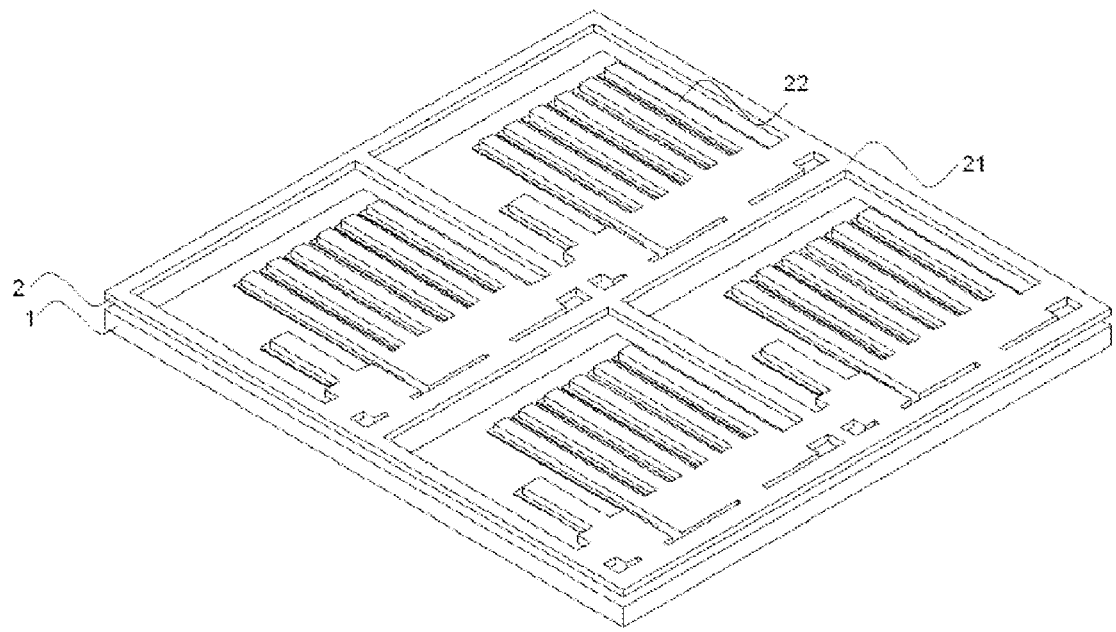
FIG. 3A is a perspective view from the upper surface of disposing the clip array on the top of the wafer according to the invention.
Figure 3B:
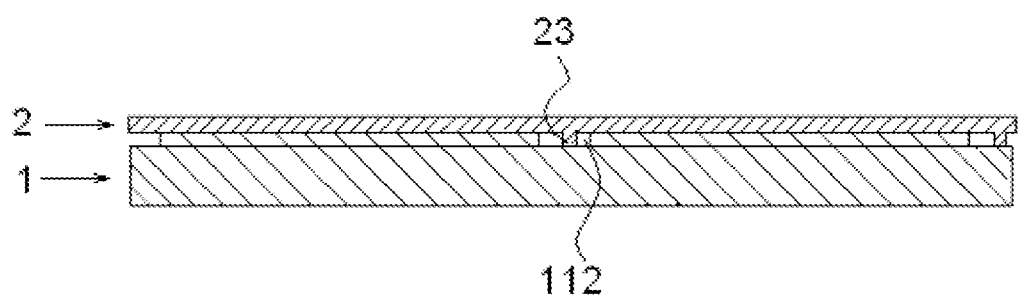
FIG. 3B is a cross sectional view of FIG. 3A.

A clip array 2 is shown in FIG. 2A and FIG. 2B as the top and bottom views. The clip array 2 comprises a plurality of framework 21 separating each clip unit from each other. Each clip unit comprises a plurality of clip contact areas 22 connected with respective clip array framework 21, and a plurality of down set connecting bars 23 connected with the clip contact areas. The clip array framework 21 divides the clip array 2 into each unit with area corresponding to each chip on the wafer. Alternatively individual clips may be provided without forming an array. As shown in FIG. 2B, the down set connecting bars 23 may be formed as cuboids embossed strips or other geometric shapes each having a down set bottom surface 231. The down set connecting bars bottom surfaces 231 are substantially in a same plane parallel to bottom surfaces of the clip contact areas 22. In the case when a clip contact area is large, the large contact area can be formed and divided into a plurality of clip contact sub-areas; and each clip contact sub-area is connected to the same down set connecting bar as shown in FIG. 2A and FIG. 2B. As shown in FIG. 3A and FIG. 3B, the plurality of clip array contact areas 22 are respectively connected with the plurality of electrodes contact areas 1111 and 1112 of each chip through conductive adhesive materials including solder paste, conductive epoxy, etc. The down set connecting bars 23 are disposed within the groove areas 112 and respectively connected with the chip top surface electrodes contact areas 1111 and 1112 through the connection of clip contact areas 22. In one preferable embodiment, the chip is a vertical power semiconductor field effect transistor provided with top and bottom electrodes; the electrode contact area 1111 of the chip is the gate of the semiconductor field effect transistor; and the electrode contact area 1112 of the chip is the source electrode of the semiconductor field effect transistor, while a drain (not shown) is located on the bottom. As the down set connecting bars 23 are connected with the clip contact areas 22, and the clip contact areas 22 are connected with the gate and source electrodes of the chips, the down set connecting bars 23 respectively lead out the gate and source electrodes of the chips such that the gate and source electrodes of the chips are extended to the bottom surfaces 231 of the clip array connecting bars 23 arranged in the groove areas 112.

Figure 4:
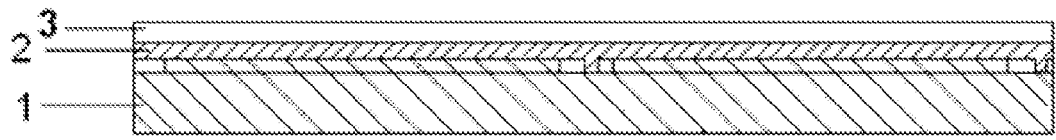
FIG. 4 is a cross sectional view of the wafer and the clip array assembly with molding encapsulation.
Figure 5:
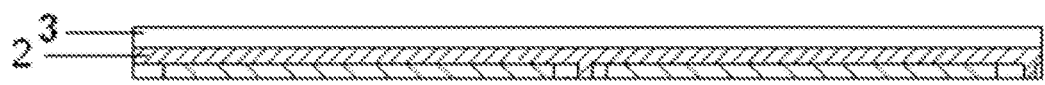
FIG. 5 is a cross sectional view of the plastically encapsulated assembly of the invention after grinding the bottom portion of the wafer.
Figure 6:
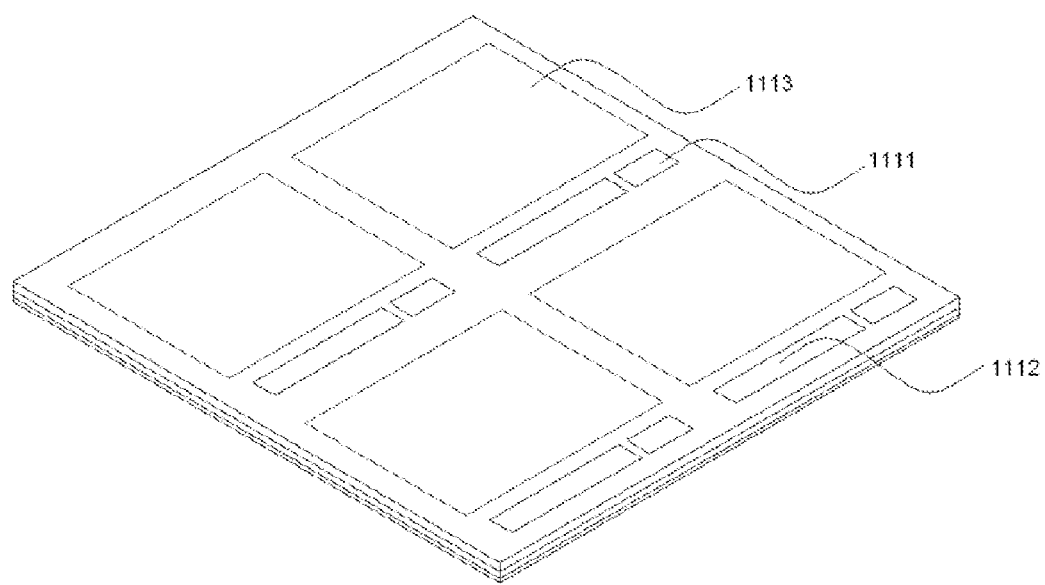
FIG. 6 is a perspective view from the bottom surface of the plastically encapsulated assembly of the invention after grinding the bottom portion of the wafer.

As shown in FIG. 4, the top portion of the wafer 1 and the clip array 2 are encapsulated by a plastic package body 3 made of molding compound; the spaces among and between the clip array 2 and the top portion of the wafer 1 are filled with molding compound thereby forming a whole wafer size encapsulation body. As single encapsulated chip needs to be obtained for actual application, the bottom portion of the wafer of the whole encapsulation body is then grinded to expose the bottom surfaces 231 connected to the electrodes of the chips and disposed within the grooves areas 112 filled with molding compound. The encapsulation body is finally cut into individual device package as shown in the FIG. 5, FIG. 6, FIG. 7 and FIG. 8.

Figure 7:
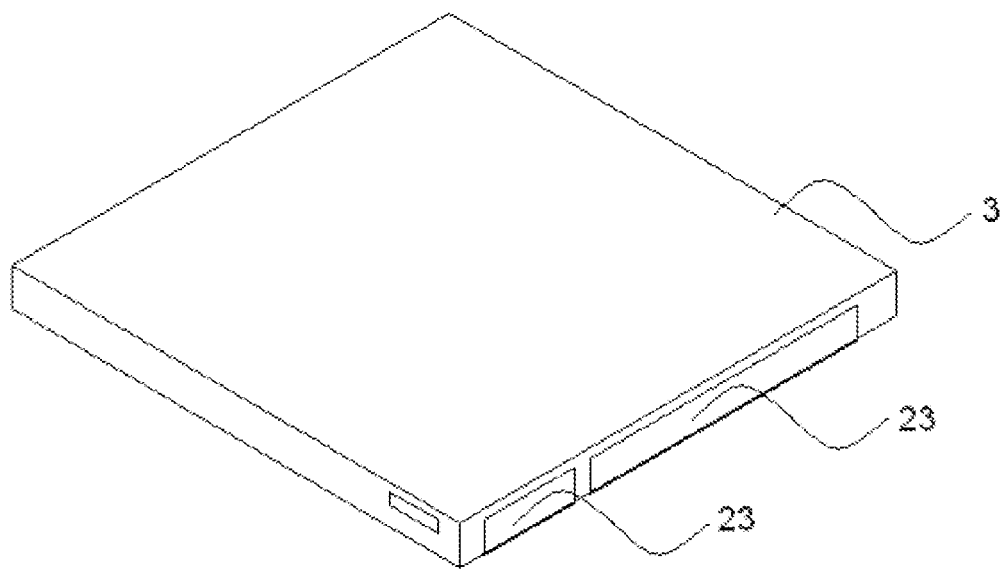
FIG. 7 is a perspective view from the upper surface of the encapsulation structure of single chip of the invention after dicing.
Figure 8:
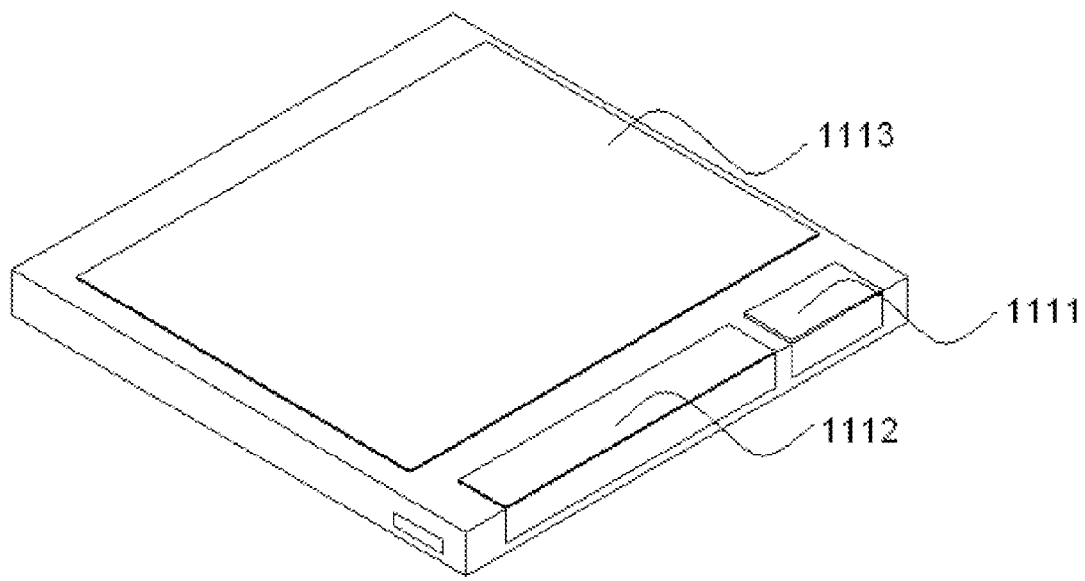
FIG. 8 is a perspective view from the bottom surface of the encapsulation structure of single chip of the invention after dicing.
Figure 9:
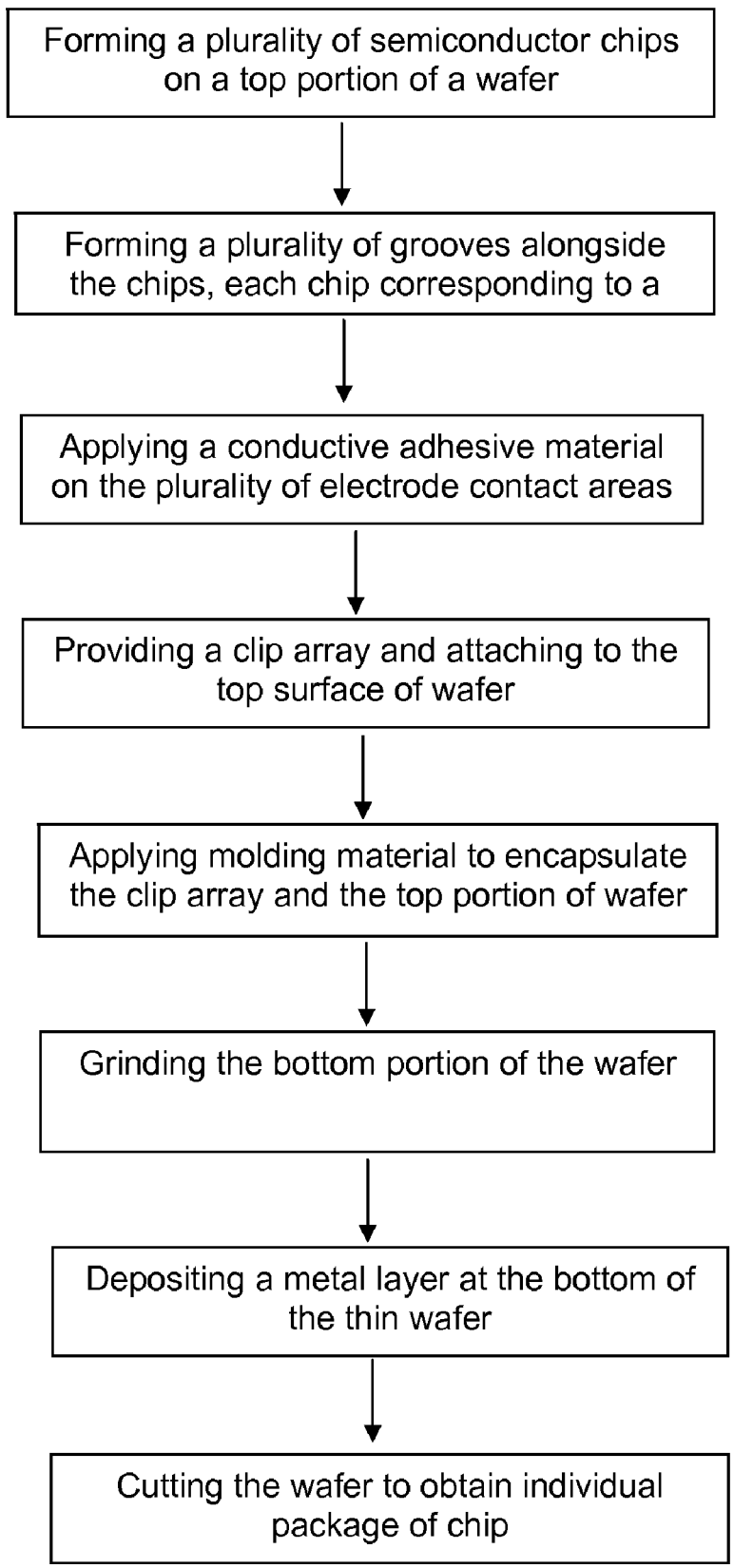
FIG. 9 is a flow chart of the manufacturing method of the invention.

As shown in FIG. 1 to FIG. 9, the invention provides a wafer level chip scale package manufacturing method using wafer size clip array including the following steps: First a wafer 1 is provided with a plurality of chips 111 manufactured on the wafer 1. In one preferable embodiment, the plurality of chips are power semiconductor field effect transistors provided with top and bottom electrodes; the bottom electrodes of the chips are drain electrodes and the top electrodes of the chips are respectively source electrodes and gate electrodes. A plurality of groove areas 112 are etched on the wafer 1 and each chip 111 is corresponding to a groove area 112. In one preferable embodiment, the groove areas 112 are connected into each other by extending along both longitudinal and transverse directions between the chips 111 to divide the plurality of chips 111. The groove areas 112 surrounding each chip may further function as scribe lines of the wafer. Then, a Ni/Au electrode plating process is implemented on the top contact areas of each chip to form a plurality of electrode contact areas 1111 and 1112 of chips as well as to pattern large size electrode contact areas into pluralities of sub-areas. Of course, Ni/Au electrode plating can also be implemented before etching the plurality of groove areas 112 or the step simply skipped in the case when the wafer 1 is provided with proper metallization electrode contact areas 1111 and 1112 on the chips. Then, a conductive adhesive material such as a solder paste, a conductive epoxy, etc, is coated on the plurality of electrode contact areas 1111 and 1112 of the chips. Next wafer size clip array 2 is provided. The clip array includes a clip array framework 21 connecting a plurality of clip units each comprising a plurality of clip contact areas and corresponding down set connecting bars 23 connected to the clip contact areas 22. The clip array framework 21 is designed to conveniently align the wafer size clip array to the wafer; the clip array framework 21 divides the wafer size clip array into clip units having a pitch and unit area corresponding to the pitch and size of the chips on the wafer. Alternatively the conductive adhesive material may be pre-coated or printed on bottom surfaces of the clip contact areas 22. In each area, the clip contact areas 22 are attached to the electrode contact areas 1111 and 1112 of chips with conductive adhesive material; meanwhile, the down set contacting bars 23 are disposed within the groove areas 112. The bottom planes of the down set connecting bars are substantially in parallel with the bottom surfaces of the clip contact areas. As the down set connecting bars 23 are physically connected with the clip contact areas 22 which are electrically connected to the electrode contact areas 1111 and 1112 of the chips, the down set connecting bars 23 extend the electrode contact areas 1111 and 1112 of chips to the bottom surfaces of the down set connecting bars located inside the groove areas 112. Then, the top portion of the wafer is encapsulated through mold injection to plastically package the clip array and the chips at the top portion 11 of the wafer. After the plastic package, the bottom portion 12 of the wafer is thinned through grinding or cutting until a bottom surface of the wafer substantially coplanar to the bottom surfaces of the down set connecting bars 23. Grinding or cutting the bottom portion of the wafer on one hand exposes the electrodes of the bottom surfaces of the down set connecting bars, on the other hand yields thin chips of 0.15 mm, 0.1 mm or even thinner, thus reducing the wafer substrate resistance. In one preferable embodiment, the chips are vertical power semiconductor field effect transistors provided with top and bottom electrodes wherein the bottom electrodes 1113 on the bottom of the chips are the drain electrodes and the gate and the source electrodes located on the top surface extend to the bottom surfaces of the down set connecting bars 23, therefore the source, the gate and the drain electrodes of the chips are brought onto the same plane. Then, deposit a metal at the bottom of the wafer to form a bottom electrode contact area of each chip. The process can be carried out by a blanket deposition process and etch with a mask to eliminate the shorts between electrodes at the bottom of the wafer, or alternatively by a masked deposition process then lift off the mask, thereby forming the electrodes of the chips exposed at the bottom of the wafer. In the case when all the electrodes of the encapsulated chips are located at the top surfaces of the chips, the step of manufacturing the electrodes of the bottom contact areas of the chips is optional. Finally, the wafer size plastic package that encapsulating plurality of chips is cut to obtain individual package of each chip. As shown in FIGS. 7 and 8, the wafer level chip scale package comprises a semiconductor chip having two electrodes on it top surface and a clip having two clip contact areas connected respectively to the two electrodes disposed on the semiconductor top surface. Each clip contact area extends and connects to a down set connecting bar disposed away from the edge of the semiconductor chip. Each down set connecting bar has a bottom surface substantially coplanar to the bottom surface of the semiconductor chip 1113. In one embodiment the semiconductor chip further comprises a third electrode disposed on the bottom surface 1113. In another embodiment, the semiconductor chip comprises a MOSFET having a source electrode and a gate electrode on the top surface and a drain electrode on a bottom surface. The source electrode contact area may be patterned into several sub-areas. Likewise, the clip contact area connected to the source electrode may be patterned into several sub-areas. As shown, the wafer level chip scale package further comprises a molding material encapsulating the semiconductor chip and the clip with the bottom surface of the semiconductor chip and the bottom surfaces of the two down set connecting bars exposed through the molding material encapsulation. The bottom surfaces of the plastic package bodies of each chip are respectively provided with source, gate and drain electrodes. Molding material fills the gaps between the down set bars and the semiconductor chip to provide insulations between electrodes.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

The invention claimed is:

1. A wafer level chip scale package encapsulation method comprising the following steps:
   step 1: forming a plurality of semiconductor chips on a top portion of a wafer wherein each semiconductor chip is provided with a plurality of top electrode contact areas;
   step 2: forming a plurality of grooves on the top portion of the wafer alongside the semiconductor chips, each semiconductor chip corresponding to a groove;
   step 3: providing a clip array comprising a plurality of clip units connected by a clip array framework, each clip unit comprising a plurality of clip contact areas corresponding to the top electrode contact areas of each semiconductor chip, each clip contact area extending to a down set connecting bar;
   step 4: disposing the clip array on top of the wafer with the plurality of clip units aligned and superimposed on the plurality of the semiconductor chips, wherein each top electrode contact area connects to a corresponding clip contact area of a clip unit superimposed over the semiconductor chip, wherein the down set connecting bars are disposed inside the groove corresponding to the semiconductor chip;
   step 5: providing a molding material to encapsulate the top portion of the wafer and at least a portion of the clip, wherein the molding material substantially fills the groove;
   step 6: thinning the bottom portion of the wafer; and
   step 7: dicing the wafer into a plurality of wafer level chip scale packages.

2. The wafer level chip scale package encapsulation method of claim 1 wherein step 1 further comprises a step of forming a plurality of top electrode contact areas with at least one contact area patterned into a plurality of subareas.

3. The wafer level chip scale package encapsulation method of claim 1 wherein in step 2, the formation of the plurality of grooves comprises forming a plurality of grooves on the top portion of the wafer completely, surrounding each of the plurality of the semiconductor chips.

4. The wafer level chip scale package encapsulation method of claim 1 wherein in step 2 the formation of the plurality of grooves comprises forming a plurality of wafer scribe lines on the top portion of the wafer that completely surround each of the plurality of the semiconductor chips.

5. The wafer level chip scale package encapsulation method of claim 1 wherein the step of providing a clip array in step 3 further provides a clip array with at least one clip contact area patterned into a plurality of subareas.

6. The wafer level chip scale package encapsulation method of claim 1 wherein the step of providing a clip array in step 3 further provides a clip array substantially the same size as the wafer.

7. The wafer level chip scale package encapsulation method of claim 1 wherein the step of disposing the down set connecting bars inside the groove corresponding to the semiconductor chip in step 4 further comprises a step of displacing the down set connecting bars away from a sidewall of the groove close to the semiconductor chip.

8. The wafer level chip scale package encapsulation method of claim 1 wherein the step of substantially filling the molding material in the groove further comprises a step of completely encapsulating the down set connecting bars inside the groove with the molding material.

9. The wafer level chip scale package encapsulation method of claim 1 wherein the step of thinning the wafer in step 6 further grinds the wafer bottom to expose bottom surfaces of the down set connecting bars.

10. The wafer level chip scale package encapsulation method of claim 1 wherein the step of thinning the wafer in step 6 further reduces a wafer thickness until a bottom of the wafer substantially coplanar to the bottom surfaces of the down set connecting bars.

11. The wafer level chip scale package encapsulation method of claim 1 wherein step 6 further comprises the following steps:
   step 6.1: depositing a metal layer at a bottom of the wafer after the wafer thinning process.

12. The wafer level chip scale package encapsulation method of claim 11 wherein step 6 further comprises the following steps:
   step 6.2: applying a mask covering a bottom of chip areas and the exposed bottom surfaces of the down set connecting bars then etch off the metal exposed through the mask.

13. The wafer level chip scale package encapsulation method of claim 1 wherein the step of forming a plurality of semiconductor chips on a top portion of a wafer comprises forming a plurality of MOSFET chips.

\* \* \* \* \*